United States Patent
Tseng et al.

(10) Patent No.: US 6,391,395 B1
(45) Date of Patent: May 21, 2002

(54) METHOD OF FABRICATING A POLYSILICON LAYER

(75) Inventors: Tzu-Feng Tseng, Hsinchu Hsien; Yi-Ming Chen, Taipei Hsien; Wen-Rei Guo, Chiayi Hsien, all of (TW)

(73) Assignee: Ritek Corporation, Hsinchu (TW)

( * ) Notice: Subject to any disclaimer, the term of this patent is extended or adjusted under 35 U.S.C. 154(b) by 52 days.

(21) Appl. No.: 09/695,438

(22) Filed: Oct. 23, 2000

(30) Foreign Application Priority Data

Aug. 18, 2000 (TW) .......................................... 89116722

(51) Int. Cl.⁷ ................................................. H05H 1/02
(52) U.S. Cl. ........... 427/574; 204/192.23; 427/255.395; 427/261; 427/376.2; 427/397.7; 427/419.1; 427/419.2; 427/419.7; 427/578; 427/596
(58) Field of Search ..................... 204/192.23; 427/574, 427/255.395, 261, 376.2, 397.7, 419.1, 419.2, 419.7, 578, 595

Primary Examiner—Bernard Pianalto
(74) Attorney, Agent, or Firm—J.C. Patents

(57) ABSTRACT

The present invention is directed to a method of forming a polysilicon layer. A light shield layer having a super-resolution near-field structure is arranged on an amorphous silicon layer. The super-resolution near-field structure includes a first dielectric layer, a second dielectric layer, and an active layer between the first dielectric layer and the second dielectric layer. The light shield layer is irradiated by a laser beam having a first intensity to generate a transmitted laser beam having a second intensity. The second intensity is greater than the first intensity. An annealing process is performed to irradiate the amorphous silicon layer with the transmitted laser beam having a second intensity thereby converting the amorphous silicon layer into a polysilicon layer.

23 Claims, 4 Drawing Sheets

METHOD OF FABRICATING A POLYSILICON LAYER

CROSS-REFERENCE TO RELATED APPLICATION

This application claims the priority benefit of Taiwan application serial no. 89116722, filed Aug. 18, 2000.

BACKGROUND OF THE INVENTION

1. Field of the Invention

The present invention relates to a method of forming a polysilicon layer. More particularly, the present invention relates to a method that effectively converts an amorphous silicon layer into a polysilicon layer by increasing the intensity of a laser beam using the super-resolution near-field structure.

2. Description of the Related Art

In recent years, polysilicon TFTs (p-Si TFTs) that have a high electron mobility are employed for forming the switching devices of high-density pixels of active matrix driven LCDs because amorphous silicon thin film (a-Si TFTs) transistors have a low electron mobility. In addition to the advantage of having the high electron mobility, the p-Si TFTs can also be used as a periphery driving circuit of a display. Thus, the p-Si TFTs are the subject of a great deal of attention and the technology for fabricating a high-quality polysilicon has became one of the major technology for manufacturing p-Si TFT transistor displays.

FIG. 1 is a schematic diagram illustrating a conventional method of forming a polysilicon layer using an excimer-laser annealing.

First, as shown in FIG. 1, an excimer-laser beam 18 having a vertical width of 5 nm and a horizontal width of 10 nm is used to irradiate a substrate 10. The excimer laser beam 18 moves along a direction 20. An amorphous silicon layer 12 on the substrate 10 is entirely irradiated by the laser beam 18 as it moves along the direction 20. Since the excimer-laser beam 18 is a pulsed excimer laser, the amorphous silicon layer 12 must be repeatedly irradiated during the annealing process to assure that the entire amorphous silicon layer 12 is sufficiently irradiated.

In the above-mentioned laser annealing process, the amorphous silicon layer 12 is subjected to a pulsed laser beam. Pulses of the excimer-laser beam 18 are used to irradiate the amorphous silicon layer 12. By repeating irradiation on the amorphous layer 12, the amorphous layer 12 is melted and then converts to a polysilicon layer. However, defects are created along an edge 16 of the irradiated regions of the polysilicon layer 14 after being irradiated by the excimer-laser beam 18. In addition, the energy applied on the edge 16 is different from the energy applied on other regions. Thus, there is a great difference between the polysilicon layer formed along edge 16 and the polysilicon layer formed on the other regions. In addition, because energy is received in different amount, the crystallization quality of the polysilicon formed along the edge 16 is poor. Therefore, during the repeating excimer laser irradiation, the region to be irradiated usually overlaps with a portion of a previously irradiated region in order to assure the quality of the polysilicon on the edge region 16.

The current excimer laser has an output power of about 100 watts. Thus, during the laser annealing process, the amorphous silicon layer 12 must be repeatedly irradiated by the laser beam 18 to assure the quality of the polysilicon along the edge 16. When the size of the array substrate 10 increases as the requirement of large liquid crystal displaying apparatus increases, such excimer-laser annealing process not only consumes a large amount of energy but is also very time-consuming. Consequently, the fabrication cost significantly increases.

SUMMARY OF THE INVENTION

The invention provides a method of forming a polysilicon layer. A light shield layer having a super-resolution near-field structure is arranged on an amorphous silicon layer. The super-resolution near-field structure includes a first dielectric layer, a second dielectric layer, and an active layer between the first dielectric layer and the second dielectric layer. The light shield layer is irradiated by a laser beam having a first intensity to generate a transmitted laser beam having a second intensity. The second intensity is greater than the first intensity. An annealing process is performed to irradiate the amorphous silicon layer with the transmitted laser beam having a second intensity thereby converting the amorphous silicon layer into a polysilicon layer.

In the present invention, the super-resolution near-field structure includes the active layer having a thickness of about 15 nm, the first dielectric layer having a thickness of about 20 nm, and the second dielectric layer having a thickness of about 170 nm. A material for the first dielectric layer and the second dielectric layer includes silicon nitride (SiNx), gallium nitride (GaNx), aluminum nitride (AlNx), and titanium nitride (TiNx). In addition, a material for the active layer includes gallium (Ga), germanium (Ge), arsenic (As), selenium (Se), indium (In), tin (Sn), antimony (Sb), tellurim (Te), and silver (Ag).

The invention uses a super-resolution near-field structure to increase the intensity of the excimer-laser beam. Thus, the present invention has no disadvantage of repeating irradiation as disclosed in the conventional method.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
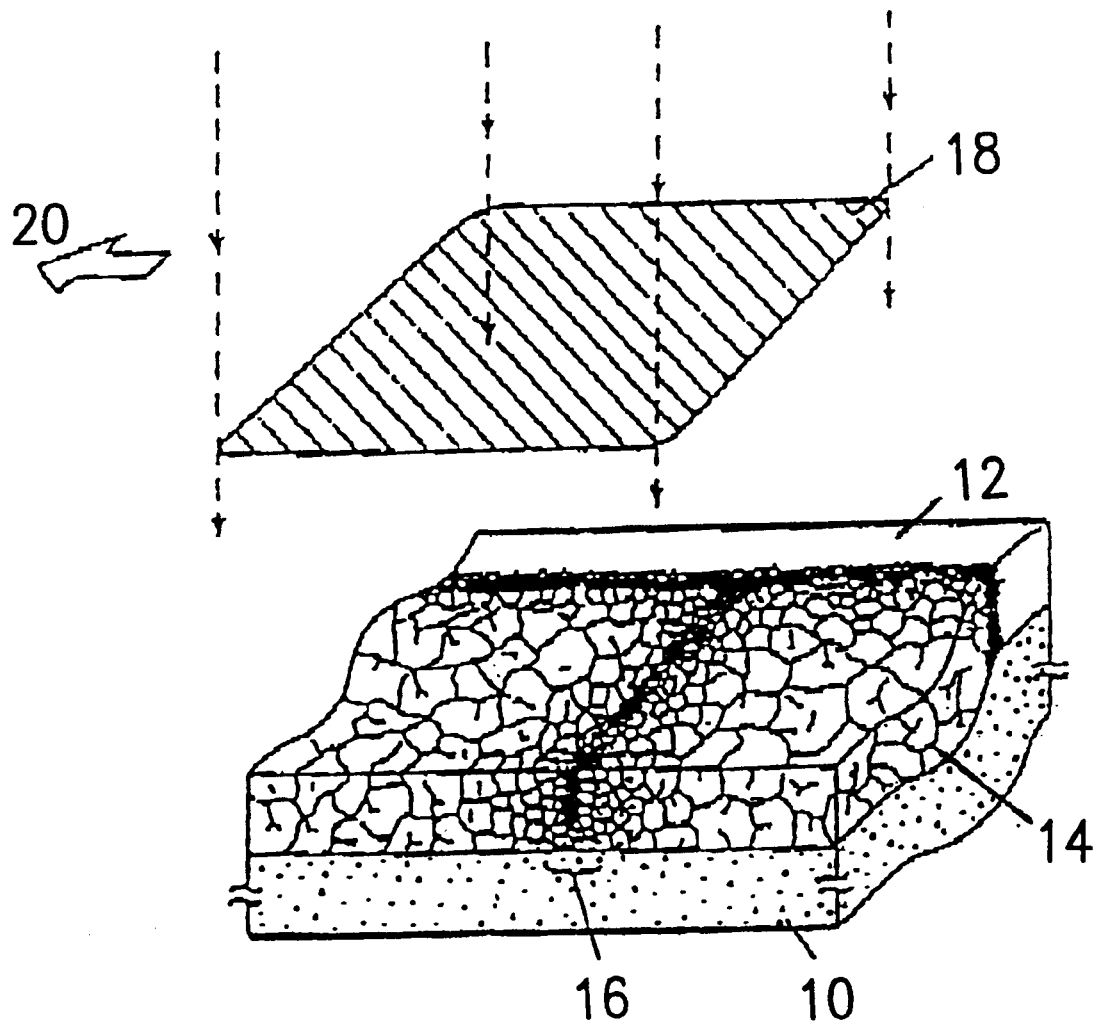
FIG. 1 is a schematic diagram illustrating a conventional method of forming a polysilicon layer using an excimer-laser annealing.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
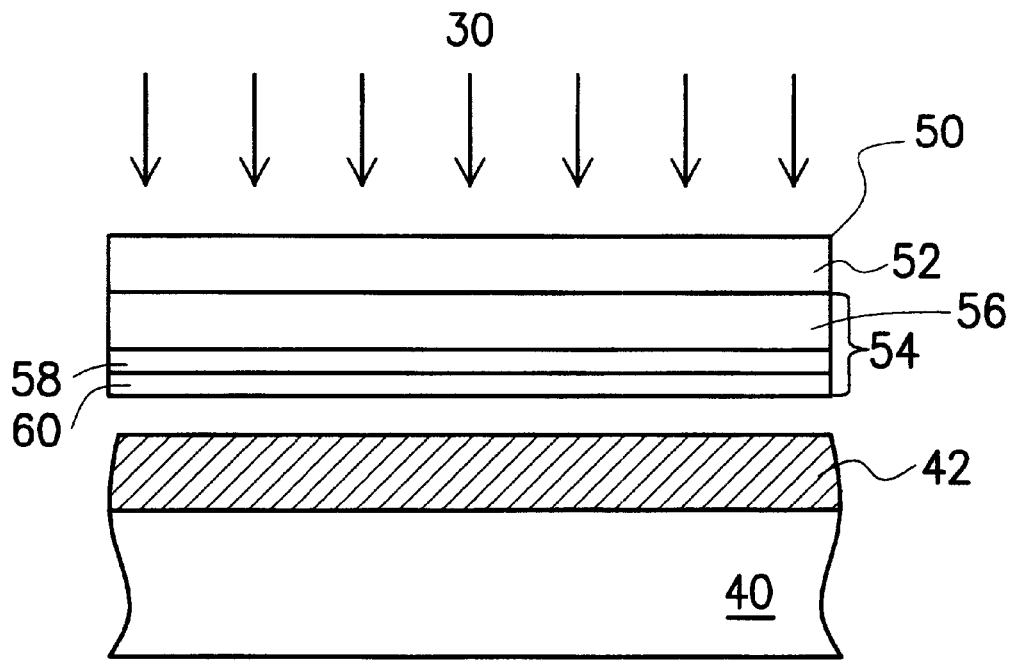
FIGS. 2A and 2B are schematic diagrams illustrating a method of forming a polysilicon layer according to a preferred embodiment of the present invention.
Figure 2B:
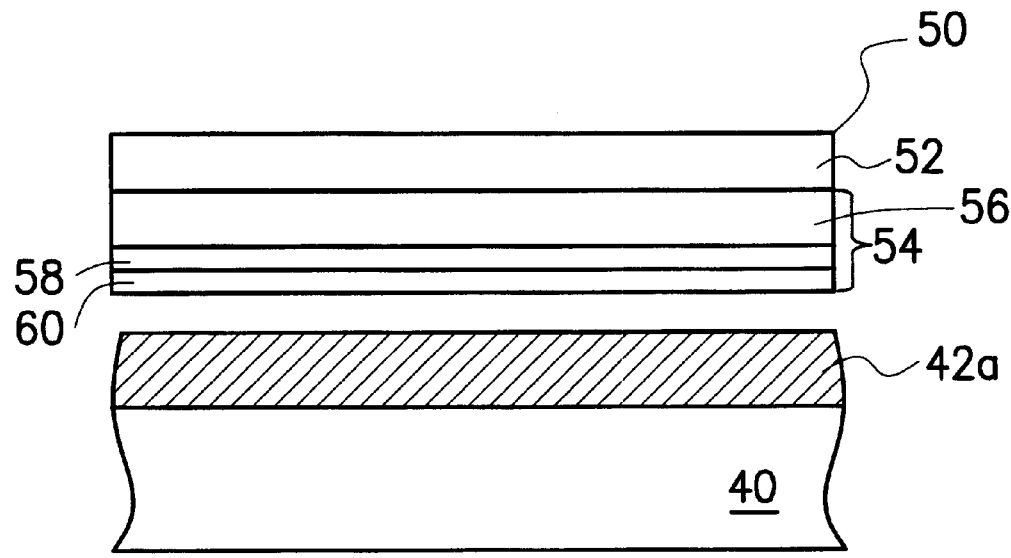

FIGS. 2A and 2B are schematic diagrams illustrating a method of forming a polysilicon layer according to a preferred embodiment of the present invention.

As shown in FIG. 2A, a substrate, such as a transparent glass substrate 40, is provided. An amorphous silicon layer 42 is formed over the glass substrate 40. For example, the amorphous silicon layer 42 is formed by, for example, plasma-enhanced chemical vapor deposition (PECVD) using silicon hexane as a reactant. In addition to this exemplary method, the amorphous silicon layer 42 can also be formed by sputtering. The amorphous silicon layer 42 has a thickness of about 30 nm to about 200 nm. Thereafter, a light shield layer 50 having a super-resolution near-field structure 54 is arranged over the amorphous silicon layer 42. The super-resolution near-field structure 54 is formed by, for example, forming a dielectric layer 56, an active layer 58, and a dielectric layer 60 in sequence on a substrate 52. A laser annealing process is performed. The light shield layer 50 is irradiated by a laser beam, which preferably is an excimer-laser beam 30. The excimer-laser beam 30 generates resonance when penetrating the active layer 58 of the light shield layer 50. The intensity of the excimer-laser beam 30 thus increases and then irradiates the amorphous silicon layer 42. The amorphous silicon layer 42 is thus converted into a polysilicon layer 42a as shown in FIG. 2B.

The distance between the super-resolution near-field structure 54 and the amorphous silicon layer 42 is less than the wavelength of the excimer-laser beam 30. In addition, the super-resolution near-field structure 54 includes the dielectric layer 60 having a thickness of about 20 nm, the dielectric layer 56 having a thickness of about 170 nm, and the active layer 58 having a thickness of about 15 nm located between the dielectric layer 60 and the dielectric layer 56.

The material for the active region 58 includes gallium (Ga), germanium (Ge), arsenic (As), selenium (Se), indium (In), tin (Sn), antimony (Sb), tellurium (Te), silver (Ag), etc. The material for the dielectric layer 56 and the dielectric layer 60 includes silicon nitride (SiNx), gallium nitride (GaNx), aluminum nitride (AlNx), and titanium nitride (TiNx).

The material for the active region 58 includes gallium oxide (GaOx), germanium oxide (GeOx), arsenic oxide (AsOx), selenium oxide (SeOx), indium oxide (InOx), tin oxide (SnOx), antimony oxide (SbOx), tellurium oxide (TeOx), and silver oxide (AgOx). In the case that the material for active region 58 are as above, the material for the dielectric layer 56 and the dielectric layer 60 preferably are includes zinc sulfide (ZnS), silicon oxide (SiOx), aluminum oxide (AlOx), titanium oxide (TiOx), etc.

Figure 3:
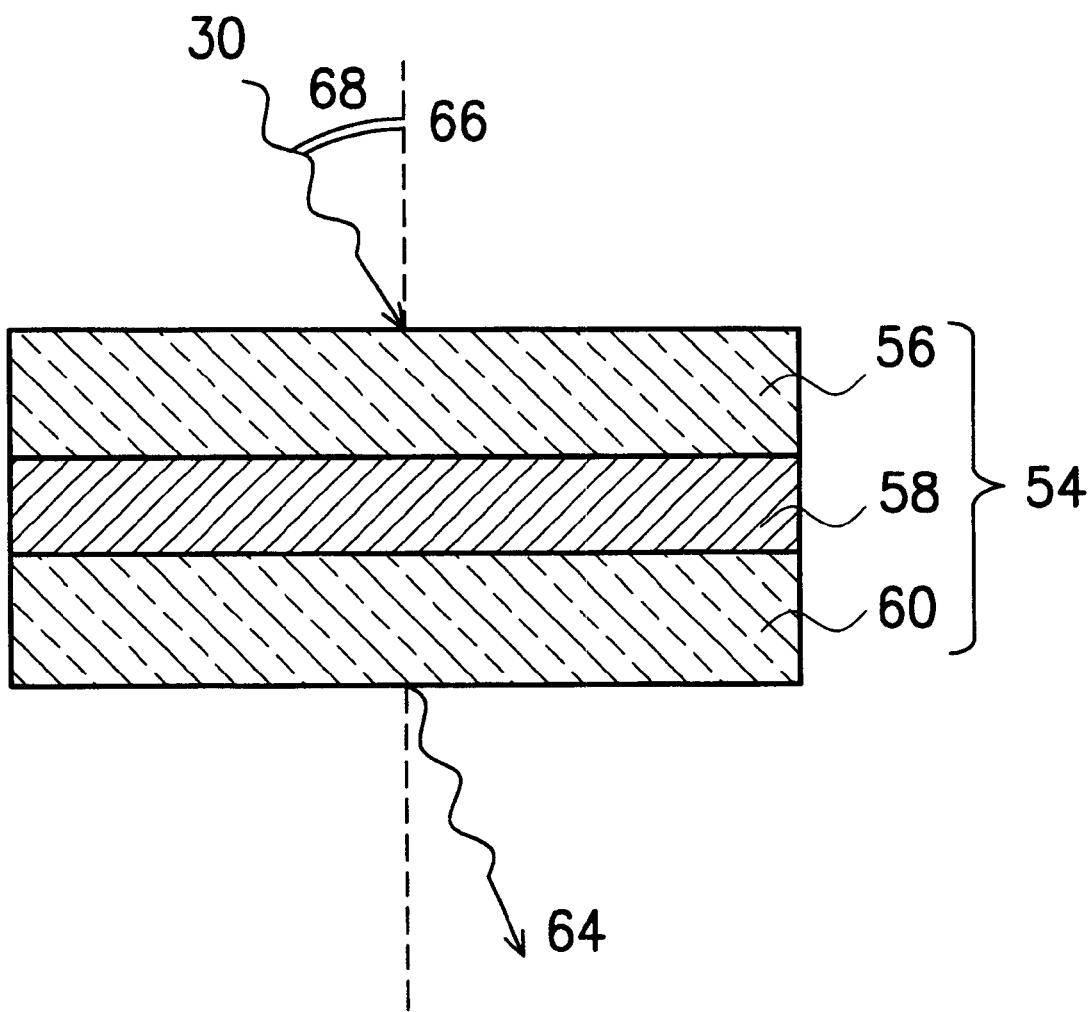
FIG. 3 is a schematic diagram illustrating an excimer laser passing through a super-resolution near-field structure.

Reference is made to FIG. 3, which is a schematic, cross-sectional diagram showing an excimer laser passing through a super-resolution near-field structure 54.

When the excimer laser beam 30 from the outside passes though the dielectric layer 56, the active layer 58, and the dielectric layer 60 in sequence, and then exits through the dielectric layer 60. The transmission rates of the laser beam 30 correspond to the dielectric layer 26, the active layer 58, and the dielectric layer 30, depend on the thickness of each layer. The other factor that affects the intensity of a penetrating beam 64 is the angle between the excimer-laser beam 30 and a normal line 66 of the super-resolution near-field structure 54, that is an incident angle 68 of the excimer-laser beam 30.

In a general condition, when the incident beam passes through a multi-layered structure composed of a metal layer or a dielectric layer, the beam intensity decreases. However, for some special material, the reverse is the case, that is to say, the intensity of the light beam increases. For example, in some multi-layered structures, the incident light is totally reflected because the incident angle is greater than the critical angle. In this situation, if each of the layers of the multi-layered structure has a proper thickness and is arranged appropriately in a manner to make incident light resonant, then an increase in the intensity of light beam output can be achieved. Ideally, a gain in intensity of several hundred times can be obtained if the multi-layered structure does not absorb lights.

Figure 4:
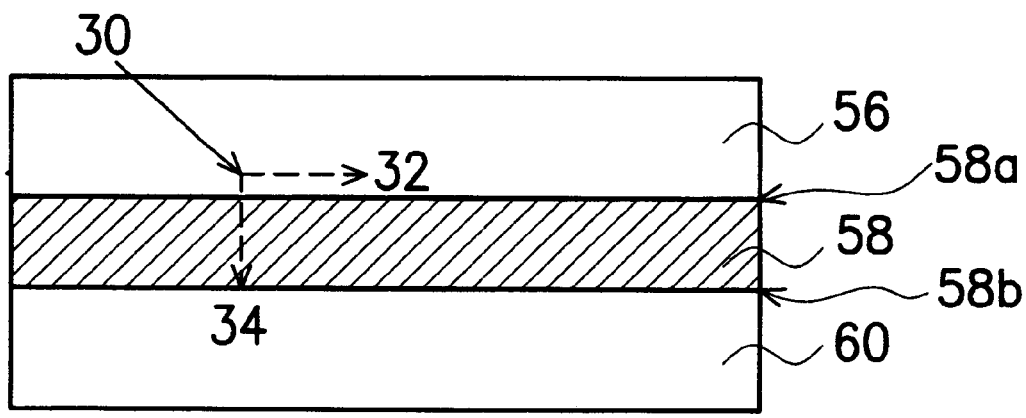
FIG. 4 is a schematic diagram illustrating the intensity components of the excimer-laser beam penetrating a metal layer.

As shown in FIG. 4, the super-resolution near-field structure 54 of the light shield layer 50 is irradiated by the excimer laser beam 30. When the excimer laser beam 30 penetrates a surface 58a of the active layer 58, the wave vector of the incident laser beam 30 includes a horizontal component 32 and a vertical component 34. The horizontal component 32 is parallel to the surface 58a of the active layer 58. The vertical component 34 is perpendicular to the surface 58a of the active layer 58. When the value of the horizontal component 32 is equal to the momentum of the free electrons on the active surface 58a, the free electrons absorb the energy of the incident light beam 30. The free electrons on the active layer 58a are thus distributed periodically according to the electromagnetic field. The material wave formed according to the electron distribution is a longitudinal wave, which does not generate radioactive electromagnetic wave on the active surface 58a and its electric field has an exponential decay according to the distance perpendicular to the active surface 58a. On the other hand, the vertical component, which is perpendicular to the active surface 58a, propagates continuously in the active layer 58. When the value of the vertical component satisfy the condition for forming a resonance standing wave, the resonance is generated. Thus, an inductive electrical field is generated on the opposite side of the active layer 58. In addition, since the refractivity of the active layer 58 is greater than the refractivities of the dielectric layers 58 and 60, the light beam reflects back and forth within the active layer 58. Because the reflectivity of the active layer 58 is large, a total reflection usually occurs. A constructive interference thus is formed. The intensity of incident laser beam penetrating through a surface 58b is increased.

Figure 5:
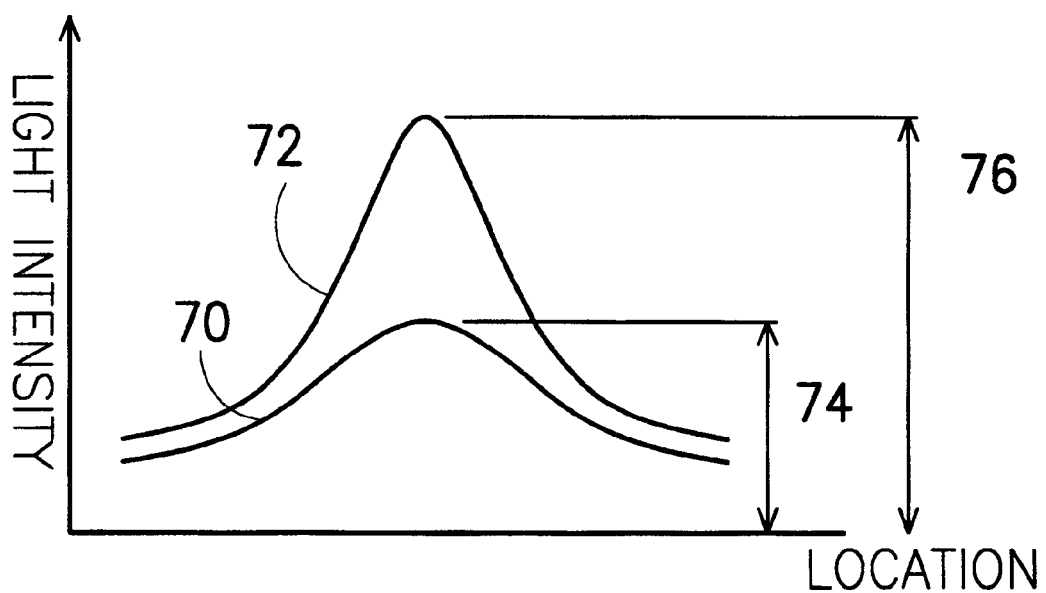
FIG. 5 is a schematic diagram illustrating an intensity distribution of light beams.

Reference is made in FIG. 5, which shows a intensity distribution of a light beam after the excimer-laser incident beam 30 passes though the super-resolution near-field structure 54. In FIG. 5, x-axis represents the point on the surface of the active layer 58 where the laser beam 30 is incident and the y-axis represents the intensity of the laser beams. As shown in FIG. 5, the intensity of the excimer-laser incident beam 30 has a gauss distribution. The excimer-laser incident beam 30 irradianting the super-resolution near-field structure 54 has a distribution, which is represented by the curve 70. In addition, curve 72 represents the intensity distribution of the transmitted excimer-laser beam 64 after the excimer-laser beam 30 passes through the super-resolution near-field structure 54. Obviously, the super-resolution near-field structure 54 greatly increases the intensity of the excimer-laser beam 30. It should be noticed that the intensity of light beam becomes greater as the location of the light beam is closer to the central portion. As shown in FIG. 5, the light intensity 76 of the transmitted light beam 64 is two times greater than the light intensity 74 of the incident laser beam 30.

The present invention uses super-resolution near-field structure 54 to increase the light intensity of the incident excimer-laser beam 30. The intensity of the excimer-laser beam 30 that irradiates the amorphous silicon layer 42 is increased. The super-resolution near-field structure 54 increases the transmitted excimer-laser beam 64. Thus, during the annealing process, the amorphous layer 42 is continuously irradiated by the transmitted excimer-laser beam 64, which is penetrating through the super-resolution near-field structure 54. The amorphous layer 42 is converted into the polysilicon layer 42a. Because the transmitted laser beam 64 irradiates continuously, the transmitted laser beam 64 of the present invention is different from the conventional pulsed laser beam. Therefore, the duration of the laser annealing is reduced. The efficiency of the laser annealing process is increased. Consequently, the requirement for forming a large liquid display is satisfied.

In the present invention, the excimer-laser beam penetrating from the super-resolution near field structure continuously irradiates the amorphous silicon layer to convert the amorphous layer into the polysilicon layer.

In addition, because of the resonance of the active region of the super-resolution near-field structure, the intensity of excimer-laser beam is increased. Thus, a rapid laser annealing is realized.

Moreover, the light intensity of the transmission excimer-laser beam is increased by the super-resolution near-field structure. Thus, the duration of the laser annealing is decreased. The requirement for forming a large crystal display is satisfied.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of forming a polysilicon layer, comprising:
   arranging a light shield layer having a super-resolution near-field structure on an amorphous silicon layer, wherein the super-resolution near-field structure comprises a first dielectric layer, a second dielectric layer, and an active layer between the first dielectric layer and the second dielectric layer;
   irradiating the light shield layer with a laser beam having a first intensity to generate a transmitted laser beam having a second intensity, wherein the second intensity is greater than the first intensity; and
   performing an annealing process to irradiate the amorphous silicon layer with the transmitted laser beam having a second intensity thereby converting the amorphous silicon layer into a polysilicon layer.

2. The method of claim 1, wherein a material for the active layer is one selected from the group consisting of gallium (Ga), germanium (Ge), arsenic (As), selenium (Se), indium (In), tin (Sn), antimony (Sb), tellurium (Te), and silver (Ag).

3. The method of claim 2, wherein a material for the first dielectric layer is one selected from the group consisting of silicon nitride (SiNx), gallium nitride (GaNx), aluminum nitride (AlNx), and titanium nitride (TiNx).

4. The method of claim 2, wherein a material for the second dielectric layer is one selected from the group consisting of silicon nitride (SiNx), gallium nitride (GaNx), aluminum nitride (AlNx), and titanium nitride (TiNx).

5. The method of claim 1, wherein a material for the active layer is one selected from the group consisting of gallium oxide (GaOx), germanium oxide (GeOx), arsenic oxide (AsOx), selenium oxide (SeOx), indium oxide (InOx), sternum oxide (SnOx), antimony oxide (SbOx), tellurium oxide (TeOx), and silver oxide (AgOx).

6. The method of claim 5, wherein a material for the second dielectric layer is one selected from the group consisting of zinc sulfide (ZnS), silicon oxide (SiOx), aluminum oxide (AlOx), and titanium oxide (TiOx).

7. The method of claim 5, wherein a material for the second dielectric layer is one selected from the group consisting of zinc sulfide, silicon oxide, aluminum oxide, and titanium oxide.

8. The method of claim 1, wherein the active layer has a thickness of about 15 nm, the first dielectric layer has a thickness of about 20 nm, and the second dielectric layer has a thickness of about 170 nm.

9. The method of claim 1, wherein the amorphous layer is deposited on a substrate by sputtering.

10. The method of claim 1, wherein the amorphous layer is deposited on a substrate by plasma-enhanced deposition.

11. The method of claim 1, wherein a distance between the super-resolution near-field structure and the amorphous layer is less than a wavelength of the laser beam.

12. A method of forming a polysilicon layer, comprising:
   arranging a light shield layer has a super-resolution near-field structure over an amorphous silicon layer;
   irradiating the light shield layer with a laser beam having a first intensity to generate a transmitted laser beam having a second intensity, wherein the second intensity is greater than the first intensity; and
   performing an annealing process to irradiate the amorphous silicon layer with the transmitted laser beam having a second intensity thereby converting the amorphous silicon layer into a polysilicon layer.

13. The method of claim 12, wherein the light shield layer having the super-resolution near-field structure comprising:
   a first dielectric layer;
   a second dielectric layer; and
   an active layer arranging between the first dielectric layer and the second dielectric layer.

14. The method of claim 13, wherein a material for the active layer is one selected from the group consisting of gallium (Ga), germanium (Ge), arsenic (As), selenium (Se), indium (In), tin (Sn), antimony (Sb), tellurim (Te), and silver (Ag).

15. The method of claim 14, wherein a material for the first dielectric layer is one selected from the group consisting of silicon nitride (SiNx), gallium nitride (GaNx), aluminum nitride (AlNx), and titanium nitride (TiNx).

16. The method of claim 14, wherein a material for the second dielectric layer is one selected from the group consisting of silicon nitride (SiNx), gallium nitride (GaNx), aluminum nitride (AlNx), and titanium nitride (TiNx).

17. The method of claim 13, wherein a material for the active layer is one selected from the group consisting of gallium oxide (GaOx), germanium oxide (GeOx), arsenic oxide (AsOx), selenium oxide (SeOx), indium oxide (InOx), sternum oxide (SnOx), antimony oxide (SbOx), tellurium oxide (TeOx), and silver oxide (AgOx).

18. The method of claim 17, wherein a material for the first dielectric layer is one selected from the group consisting of zinc sulfide, silicon oxide, aluminum oxide, and titanium oxide.

19. The method of claim 17, wherein a material for the first dielectric layer is one selected from the group consisting of zinc sulfide, silicon oxide, aluminum oxide, and titanium oxide.

20. The method of claim 13, wherein the active layer has a thickness of about 15 nm, the first dielectric layer has a thickness of about 20 nm, and the second dielectric layer has a thickness of about 170 nm.

21. The method of claim 13, wherein a distance between the super-resolution near-field structure and the amorphous layer is less than a wavelength of the laser beam.

22. The method of claim 13, wherein the amorphous layer is deposited on a substrate by sputtering.

23. The method of claim 13, wherein the amorphous layer is deposited on a substrate by plasma-enhanced deposition.

* * * * *